(12) United States Patent
Kim et al.

(10) Patent No.: US 8,884,520 B2
(45) Date of Patent: Nov. 11, 2014

(54) IMPEDANCE MATCHING APPARATUS

(75) Inventors: Jae Hyun Kim, Daejeon (KR); Sang Won Lee, Daejeon (KR); Yong Gwan Lee, Daejeon (KR)

(73) Assignee: Plasmart Inc., Daejeon (KR)

( * ) Notice: Subject to any disclaimer, the term of this patent is extended or adjusted under 35 U.S.C. 154(b) by 42 days.

(21) Appl. No.: 13/571,167

(22) Filed: Aug. 9, 2012

(65) Prior Publication Data

US 2012/0306367 A1   Dec. 6, 2012

Related U.S. Application Data

(63) Continuation of application No. PCT/KR2010/008269, filed on Nov. 23, 2010.

(30) Foreign Application Priority Data

Feb. 23, 2010   (KR) .................. 10-2010-0016065

(51) Int. Cl.
| | |
|---|---|
| *H01J 19/78* | (2006.01) |
| *H05H 1/46* | (2006.01) |
| *H03H 7/40* | (2006.01) |
| *H01J 37/32* | (2006.01) |

(52) U.S. Cl.
CPC . *H05H 1/46* (2013.01); *H03H 7/40* (2013.01); *H05H 2001/4682* (2013.01); *H01J 37/32183* (2013.01); *H01J 37/32091* (2013.01)
USPC ....................................... 315/53; 315/111.51

(58) Field of Classification Search
USPC ............... 315/51–54, 111.21, 111.41, 111.51
See application file for complete search history.

(56) References Cited

U.S. PATENT DOCUMENTS

| | | |
|---|---|---|
| 6,199,506 B1 | 3/2001 | Hilliker et al. |
| 2003/0054647 A1* | 3/2003 | Suemasa et al. ............. 438/689 |
| 2005/0133163 A1* | 6/2005 | Shannon et al. ......... 156/345.44 |

FOREIGN PATENT DOCUMENTS

| | | |
|---|---|---|
| CN | 101242704 | 8/2008 |
| EP | 0421430 | 4/1991 |
| JP | P2008-187181 A | 8/2008 |
| KR | 10-1998-0042054 A | 8/1998 |
| KR | 10-2003-0043669 A | 2/2003 |

OTHER PUBLICATIONS

International Search Report for PCT/KR2010/008269 dated Nov. 23, 2010.

* cited by examiner

*Primary Examiner* — Daniel D Chang
(74) *Attorney, Agent, or Firm* — Jenkins, Wilson, Taylor & Hunt, P.A.

(57) ABSTRACT

Provided is an impedance matching apparatus for matching impedance to a plasma load. The impedance matching apparatus includes a first frequency impedance matching circuit unit that transfers an output of a first frequency RF power source unit, operating at a first frequency, to the plasma load; and a second frequency impedance matching circuit unit that transfers an output of a second frequency RF power source unit, operating at a second frequency higher than the first frequency, to the plasma load. The first frequency impedance matching circuit unit includes a T-type matching circuit, and the second frequency impedance matching circuit unit includes a standard L-type matching circuit or Π-type matching circuit.

17 Claims, 15 Drawing Sheets

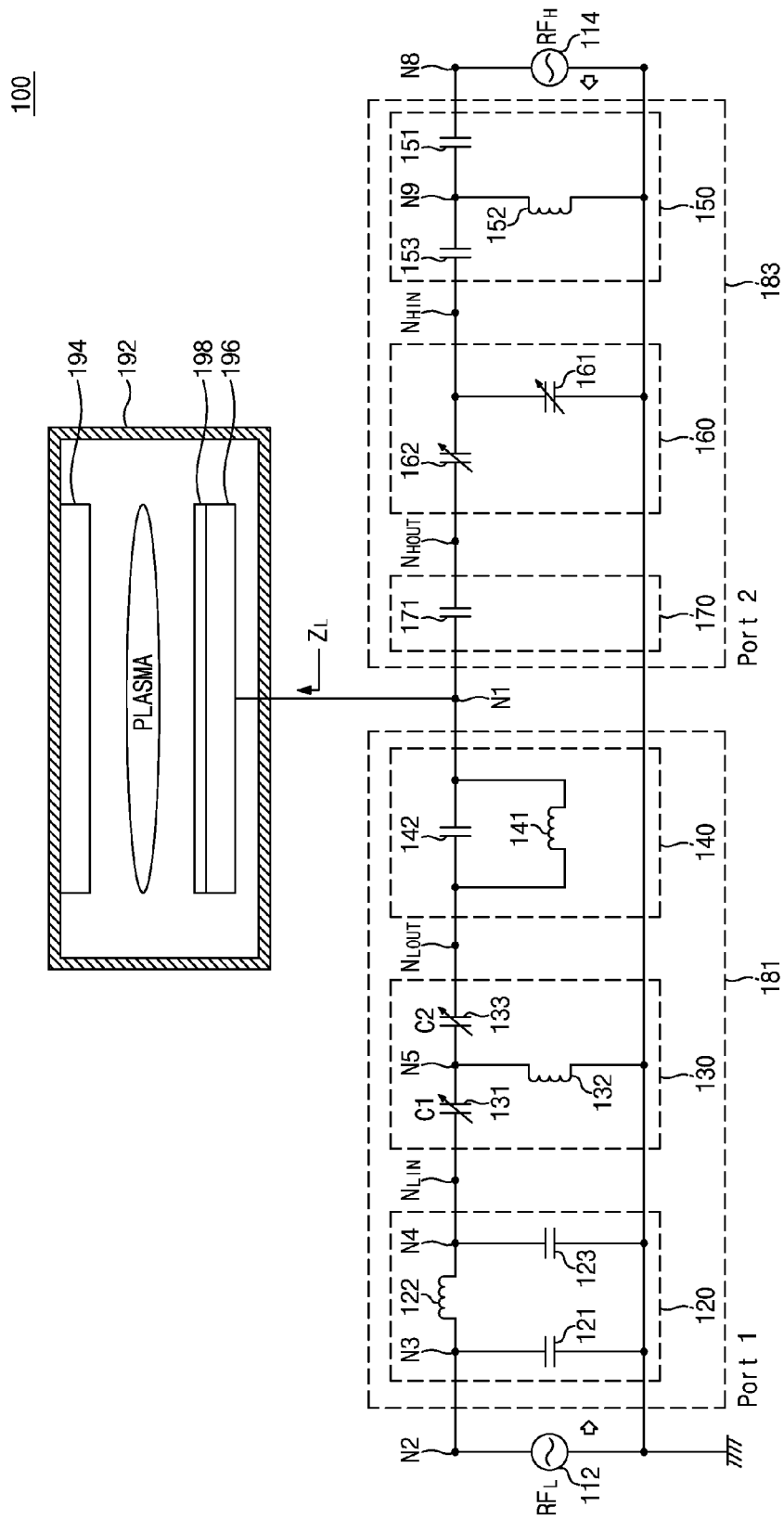
Fig. 12 (Amended)

IMPEDANCE MATCHING APPARATUS

CROSS-REFERENCE TO RELATED APPLICATIONS

This application is a continuation of and claims priority to PCT/KR2010/008269 filed on Nov. 23, 2010, which claims priority to Korea Patent Application No. 10-2010-0016065 filed on Feb. 23, 2010, the entireties of which are both hereby incorporated by reference.

BACKGROUND OF THE INVENTION

1. Field of the Invention

The present invention relates to impedance matching apparatuses and, more particularly, to a dual-frequency impedance matching apparatus.

2. Description of the Related Art

Conventionally, a capacitively-coupled plasma device has been used in a semiconductor manufacturing process or a flat panel display manufacturing process. Plasma processing characteristics may be enhanced by connecting radio-frequency (RF) powers with different frequencies to electrodes. A dual-frequency impedance matching apparatus supplies RF powers with two different frequencies to a plasma load.

SUMMARY OF THE INVENTION

Embodiments of the present invention provide an dual-frequency impedance matching apparatus which can provide broad matching area without interference.

In an aspect of the present invention, there is provided an impedance matching apparatus for matching impedance to a plasma load. The impedance matching apparatus may include a first frequency impedance matching circuit unit configured to transfer an output of a first frequency RF power source unit, operating at a first frequency, to the plasma load; and a second frequency impedance matching circuit unit configured to transfer an output of a second frequency RF power source unit, operating at a second frequency higher than the first frequency, to the plasma load. The first frequency impedance matching circuit unit includes a T-type matching circuit, and the second frequency impedance matching circuit unit includes a standard L-type matching circuit or a Π-type matching circuit.

In an example embodiment of the present invention, the T-type matching circuit may include a first variable capacitor connected to an input terminal $N_{LIN}$ receiving a power of the first frequency RF power source unit; a second variable capacitor having one end connected the first variable capacitor and the other end connected to an output terminal $N_{LOUT}$ outputting a power of the first frequency RF power source unit; and a first inductor having one end connected to a connection terminal of the first variable capacitor and the second variable capacitor and the other end grounded.

In an example embodiment of the present invention, the first frequency may be one of 0.1 to 14 MHz, and the second frequency may be one of 10 to 200 MHz.

In an example embodiment of the present invention, the first frequency impedance matching circuit unit may further include a first frequency output filter unit disposed between the T-type matching circuit and the plasma load. The first frequency output filter unit may includes a fixed capacitor having one end connected to an output terminal of the T-type impedance matching circuit and the other end connected to the plasma load; and an inductor connected in parallel to the fixed capacitor. The first frequency output filter unit may be a bandstop filter stopping a second frequency component through LC resonance.

In an example embodiment of the present invention, the first frequency output filter unit may have a reactance of −1000 ohms or less at the second frequency.

In an example embodiment of the present invention, the T-type matching circuit may further include a second inductor coupled between the connection terminal and the second variable capacitor.

In an example embodiment of the present invention, the T-type matching circuit may further include a fixed capacitor having one end connected to the output terminal $N_{LOUT}$ and the other end grounded.

In an example embodiment of the present invention, the impedance matching apparatus may further include a first frequency input filter unit disposed between the first frequency impedance matching circuit unit and the first frequency RF power source unit. The first frequency input filter unit may include an inductor disposed between an output terminal of the first frequency RF power source unit and the input terminal of the T-type matching circuit; a first fixed capacitor having one end connected to an output terminal of the first frequency RF power source unit and the other end grounded; and a second fixed capacitor having one end connected to the input terminal of the second T-type matching circuit and the other end grounded.

In an example embodiment of the present invention, the standard L-type matching circuit may include a first variable capacitor coupled between an input terminal $N_{HIN}$ receiving a power of the second frequency RF power source unit and a ground; and a second variable capacitor having one end connected to the input terminal $N_{HIN}$ and the other end connected to an output terminal $N_{HOUT}$ transferring the power of the second frequency RF power source unit.

In an example embodiment of the present invention, the second frequency impedance matching circuit unit may further include a second frequency output filter unit disposed between the standard L-type matching circuit and the plasma load. The second frequency output filter unit may include a fixed capacitor disposed between an output terminal of the standard L-type matching circuit and the plasma load. The second frequency output filter unit may be a highpass filter passing the second frequency component, and an absolute value of impedance of the second frequency output filter unit may be 1000 ohms or more at the first frequency.

In an example embodiment of the present invention, the second frequency matching circuit unit may further include a second frequency input filter unit disposed between an input terminal of the standard L-type matching circuit and an output terminal of the second frequency RF power source unit. The second frequency input filter unit may include a first capacitor having one end connected to the output terminal of the second frequency RF power source unit; a second capacitor having one end connected to an input terminal of the second frequency matching circuit unit and the other end connected to the other end of the first capacitor; and an inductor having one end connected to a connection terminal N9 of the first capacitor and the second capacitor and the other end grounded.

In an example embodiment of the present invention, the standard L-type matching circuit may further include an inductor connected in series to the second variable capacitor and having one end connected to the input terminal.

In an example embodiment of the present invention, the standard L-type matching circuit may further include an inductor connected in series to the first variable capacitor and having one end grounded.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

FIG. 12 illustrates an impedance matching apparatus according to an embodiment of the present invention.

DETAILED DESCRIPTION OF EMBODIMENTS

Figure 1:
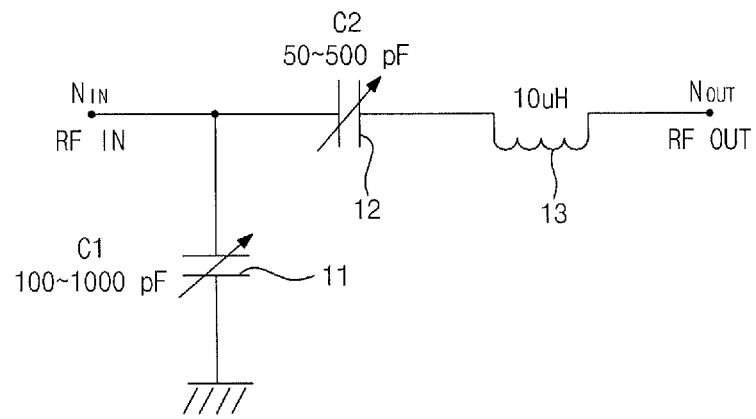
FIGS. 1 to 3 illustrate a standard L-type matching circuit, the Smith Chart of the matching circuit, and an equivalent circuit diagram of the matching circuit, respectively.

The present invention will be described more fully hereinafter with reference to the accompanying drawings, in which preferred embodiments of the invention are shown. This invention may, however, be embodied in many different forms herein. Rather, these embodiments are provided so that this disclosure will be thorough and complete, and will fully convey the scope of the invention to those skilled in the art. In the drawings, like numbers refer to like references.

Figure 2:
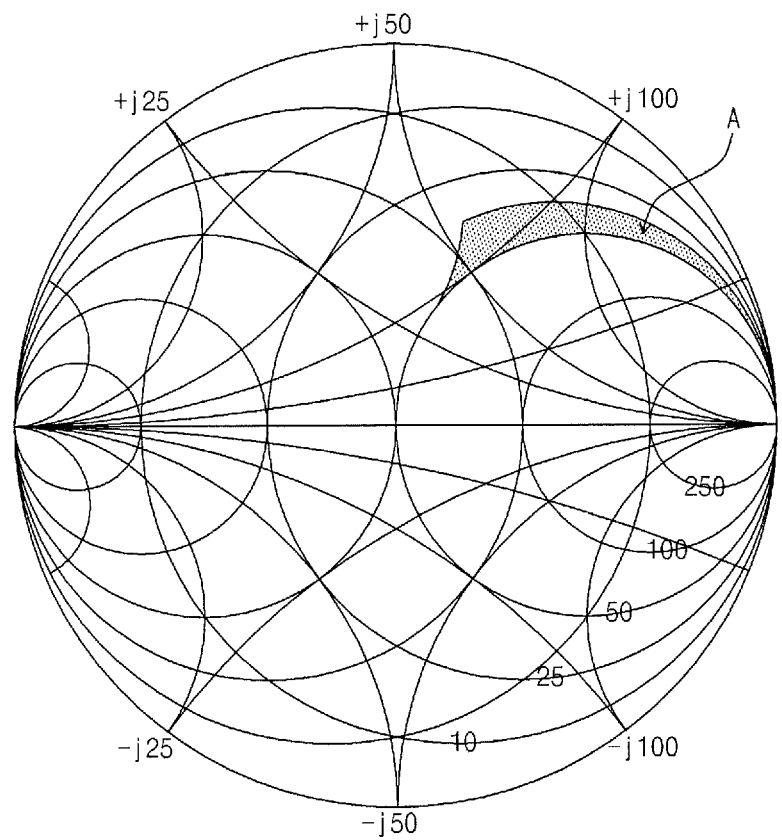
Figure 3:
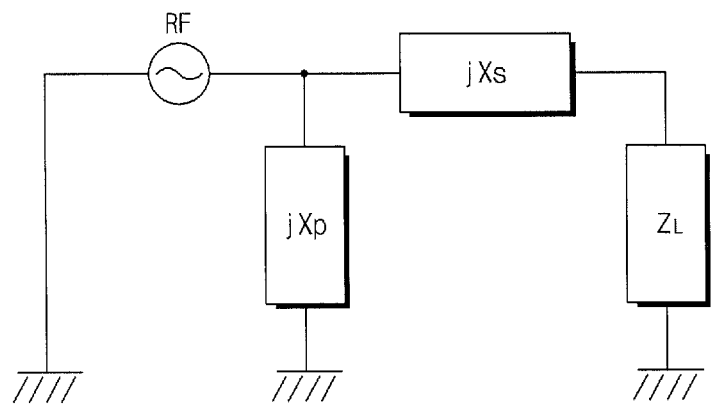

FIGS. 1 to 3 illustrate a standard L-type matching circuit, the Smith Chart of the matching circuit, and an equivalent circuit diagram of the matching circuit, respectively.

Referring to FIGS. 1 and 2, a first variable capacitor (C1) 11 is coupled between an input terminal $N_{IN}$ and a ground. A second variable capacitor (C2) 13 is serially coupled between the input terminal $N_{IN}$ and an output terminal $N_{OUT}$. An inductance of the inductor 13 may be 10 μH.

When a frequency supplied to the input terminal $N_{IN}$ is 2 MHz, an inductance of the inductor 13 is 1 μH, capacitance of the first variable capacitor 11 is 100 to 1000 pF, and capacitance of the second variable capacitor 12 is 50 to 500 pF, a region "A" on the Smith Chart represents a load impedance area which is capable of meeting the matching condition with the circuit. Therefore, at the frequency of 2 MHz, the capacitances of the first and second variable capacitors 11 and 12 are limited in achieving impedance matching with respect to any load. Conventionally, a standard L-type matching circuit is often used due to its ease of control. When a real part of impedance of the load is 50 ohms or more, the standard L-type matching circuit cannot provide impedance matching.

Referring to FIG. 3, there are two solutions, which meet matching, for any load ($Z_L$=r+jx). A reactance Xs of components connected in series and a reactance Xp of components connected in parallel are given by equation (1), as follows:

$$X_s = +/- \sqrt{r(Z_o-r)} - x \qquad \text{Equation (1)}$$

(double signs in same order)

The other solution Xp is given by equation (2), as follows:

$$X_P = -/+ \frac{\sqrt{r}}{\sqrt{(Z_O - r)}} \qquad \text{Equation (2)}$$

wherein $Z_O$ represents characteristic impedance of a transmission line.

Since the value in the square root must be positive, there is a need for a condition that r<$Z_O$. However, since real resistance of a practical plasma load may exceed 50 ohms, the standard L-type matching circuit may not be applied to the case where real resistance of a practical plasma load exceeds 50 ohms.

Figure 4:
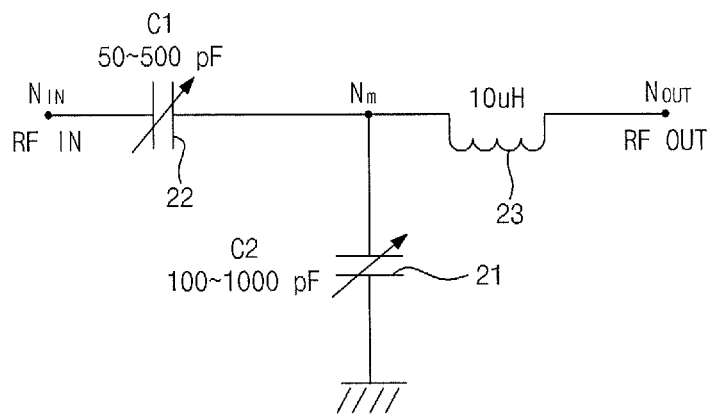
FIGS. 4 and 5 illustrate an inverted L-type matching circuit and the Smith Chart of the matching circuit, respectively.
Figure 5:
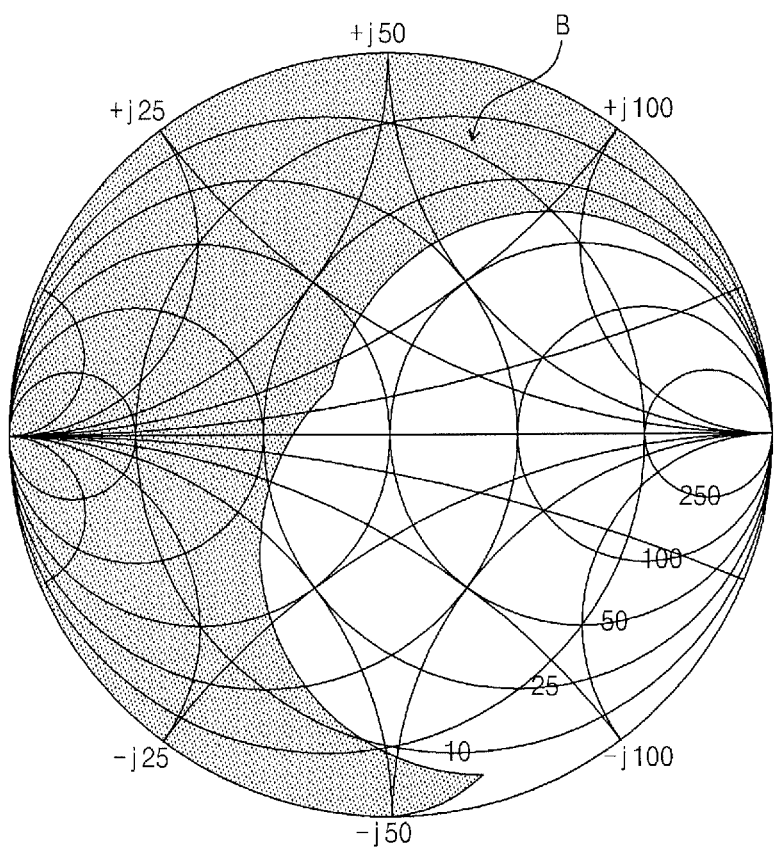

FIGS. 4 and 5 illustrate an inverted L-type matching circuit and the Smith Chart of the matching circuit, respectively.

Referring to FIGS. 4 and 5, a first variable capacitor 22 and an inductor 23 are serially coupled between an input terminal $N_{IN}$ and an output terminal $N_{OUT}$. The first variable capacitor 22 is connected to the input terminal $N_{IN}$, and the inductor 23 is connected to the output terminal $N_{OUT}$. The second variable capacitor 21 is coupled between a ground and a connection terminal Nm of the first variable capacitor 22 and the inductor 23.

When a frequency supplied to the input terminal $N_{IN}$ is 2 MHz, an inductance of the inductor 23 is 1 μH, capacitance of the first variable capacitor 22 is 50 to 500 pF, and capacitance of the second variable capacitor 21 is 100 to 1000 pF, a region "B" on the Smith Chart represents a load impedance area which is capable of achieving the matching. Practically, the variable capacitors 22 and 21 are limited in capacitance. Therefore, at the frequency of 2 MHz, the capacitances of the first and second variable capacitors 11 and 12 are limited in achieving impedance matching with respect to any load.

Figure 6:
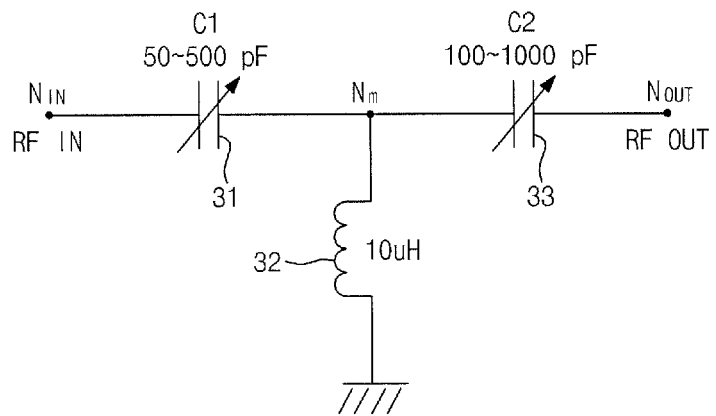
FIGS. 6 and 7 illustrate a T-type matching circuit and the Smith Chart of the matching circuit, respectively.
Figure 7:
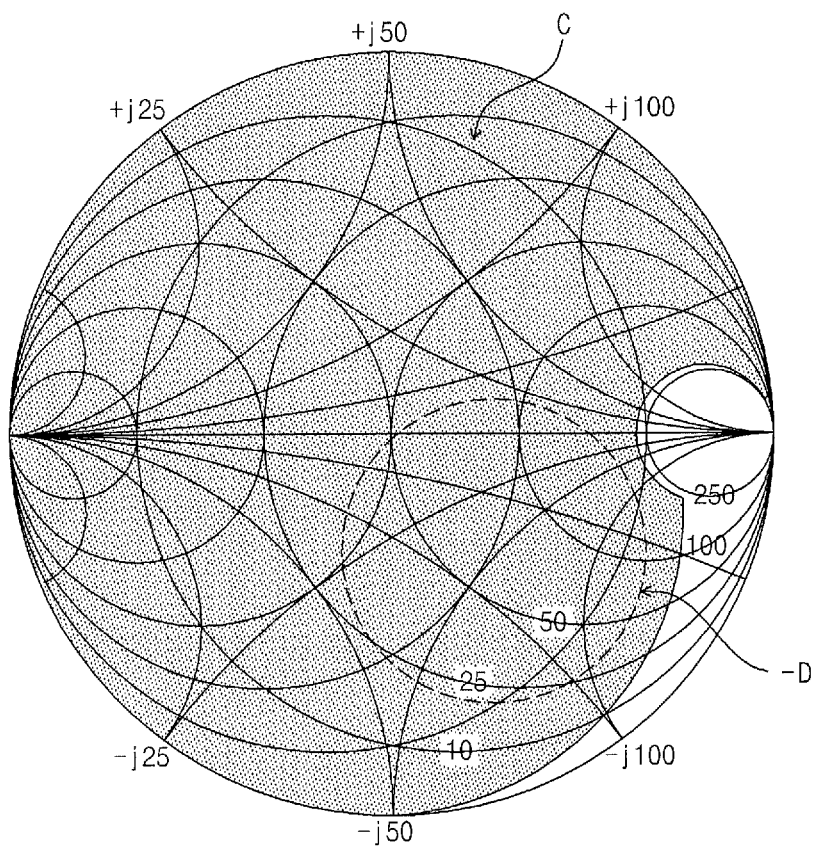

FIGS. 6 and 7 illustrate a T-type matching circuit and the Smith Chart of the matching circuit, respectively.

Referring to FIGS. 6 and 7, a first variable capacitor 31 and a second variable capacitor 33 are serially coupled between an input terminal $N_{IN}$ and an output terminal $N_{OUT}$. An inductor 32 is coupled between a ground and a connection terminal Nm of the first and second variable capacitors 31 and 33. One end of the first variable capacitor 31 is connected to the input terminal $N_{IN}$, and one end of the second variable capacitor 33 is connected to the output terminal $N_{OUT}$.

When a frequency supplied to the input terminal $N_{IN}$ is 2 MHz, an inductance of the inductor 32 is 1 μH, capacitance of the first variable capacitor 31 is 50 to 500 pF, and capacitance of the second variable capacitor 33 is 100 to 1000 pF, a region "C" on the Smith Chart represents a load impedance area which is capable of achieving the matching.

Therefore, at the frequency of 2 MHz, the T-type matching circuit is limited in achieving impedance matching with respect to any load. At the frequency of 2 MHz, the T-type matching circuit may secure a wide matching area than the standard L-type matching circuit and the inverted L-type matching circuit.

A dual frequency matching circuit includes a low-frequency matching circuit in a low-frequency region and a high-frequency matching circuit in a high-frequency region. Conventionally, a matching circuit in a low-frequency region employs a standard L-type or inverted L-type matching circuit due to its ease of control. However, in case of a variable load such as plasma, the standard L-type or inverted L-type matching circuit is limited in impedance matching.

In the case where a load is plasma, in a low-frequency region, a region in which a reflection coefficient Γ is positioned mainly appears in a D region in FIG. 7. Accordingly, the T-type matching circuit may achieve impedance matching in a wider area than in a standard L-type or inverted L-type matching circuit using the same component.

A recent plasma processing apparatus changes a distance between electrodes or a gas during a process. Accordingly, under the environment where impedance of a load varies depending on time, the standard L-type or inverted L-type matching circuit is limited in impedance matching.

On the other hand, when a frequency supplied to the input terminal $N_{IN}$ is 60 MHz, an inductance of the inductor 32 is 1 μH, capacitance of the first variable capacitor 31 is 50 to 500 pF, and capacitance of the second variable capacitor 33 is 100 to 1000 pF, a region that can be scanned on the Smith Chart (not shown) of the standard L-type or inverted L-type matching circuit is extended. Accordingly, in the region of 60 MHz, the standard L-type or inverted L-type matching circuit may perform impedance matching with respect to a variable load. Thus, the practical benefit using the T-type matching circuit in the high-frequency region is reduced.

An impedance matching apparatus according to an embodiment of the present invention a T-type matching circuit operating in a low-frequency region and a standard L-type matching circuit operating in a high-frequency region.

Figure 8:
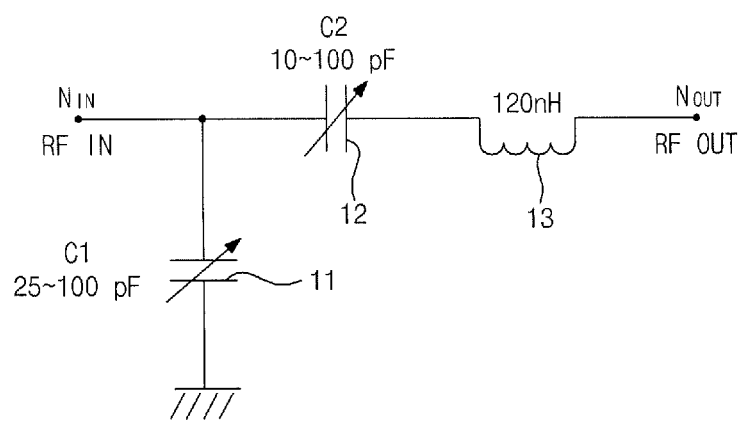
FIGS. 8 and 9 illustrate a standard L-type matching circuit and the Smith Chart of the matching circuit, respectively.
Figure 9:
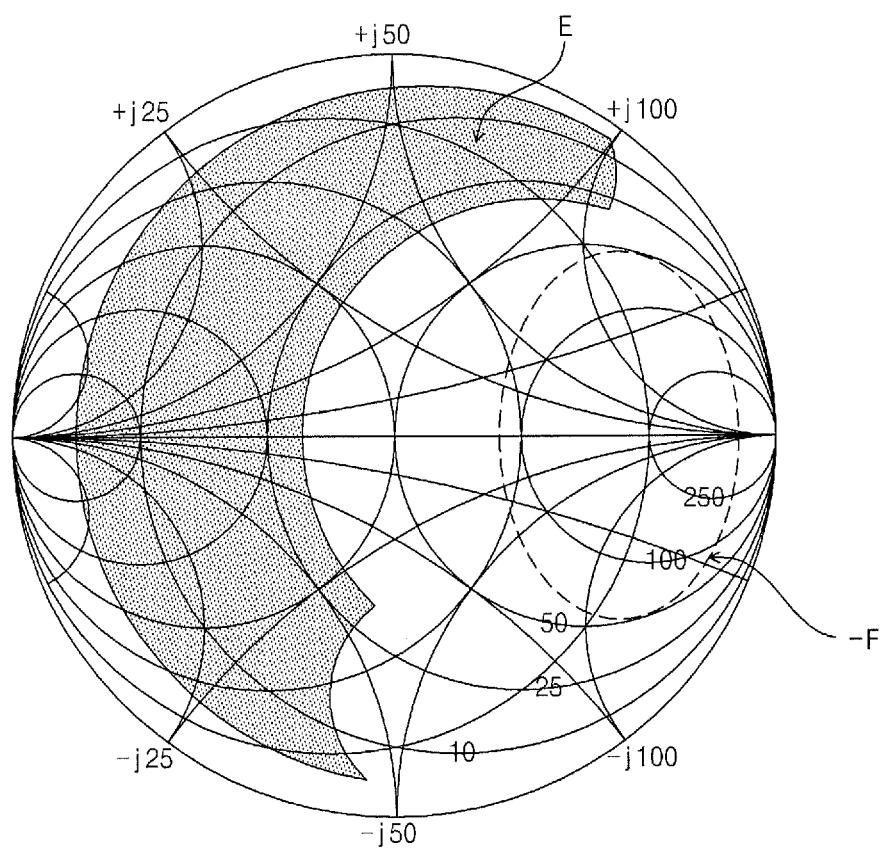

FIGS. 8 and 9 illustrate a standard L-type matching circuit and the Smith Chart of the matching circuit, respectively.

Referring to FIGS. 8 and 9, a first variable capacitor (C1) 11 is coupled between an input terminal $N_{IN}$ and a ground. A second variable capacitor (C2) 12 is serially coupled between the input terminal $N_{IN}$ and an output terminal $N_{OUT}$. An inductance of an inductor 13 may be 120 nH.

When a frequency supplied to the input terminal $N_{IN}$ is 100 MHz, the inductance of the inductor 32 is 1 μH, capacitance of the first variable capacitor 11 is 25 to 100 pF, and capacitance of the second variable capacitor 33 is 10 to 100 pF, a region that can be scanned on the Smith Chart is represented by E. Practically, there is a limitation in minimum capacitance of the first and second variable capacitors 11 and 12. Thus, at the 100 MHz, a standard L-type matching circuit is limited in performing impedance matching with respect to any load.

When the frequency is 100 MHz, a plasma load may be disposed in an F region. When a real part of the plasma load is 50 ohms or more, the standard L-type matching circuit may not perform impedance matching. In this case, an imaginary part of the plasma load may be hundreds of ohms. Conventionally, the maximum capacitance of an available vacuum variable capacitor is about 10 pF. However, when the imaginary part of the plasma load is hundreds of ohms, the capacitance of the second variable capacitor 12 must be low enough to perform impedance matching. Thus, in this case, the standard L-type matching circuit may be limited in matching.

Hereinafter, there will be described a Π-type matching circuit which is capable of performing impedance matching when an imaginary part of a plasma load is 50 ohms or greater.

Figure 10:
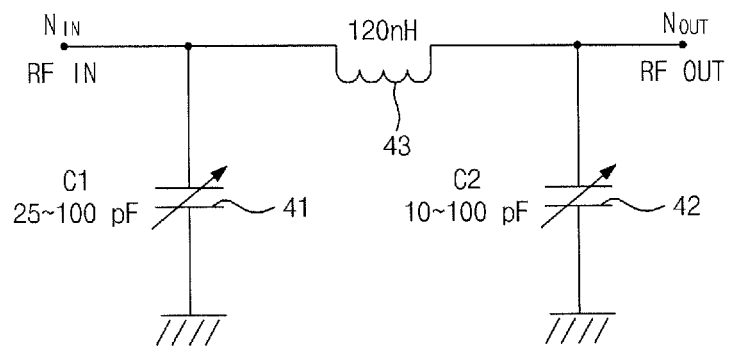
FIGS. 10 and 11 illustrate a H-type matching circuit and the Smith Chart of the matching circuit, respectively.
Figure 11:
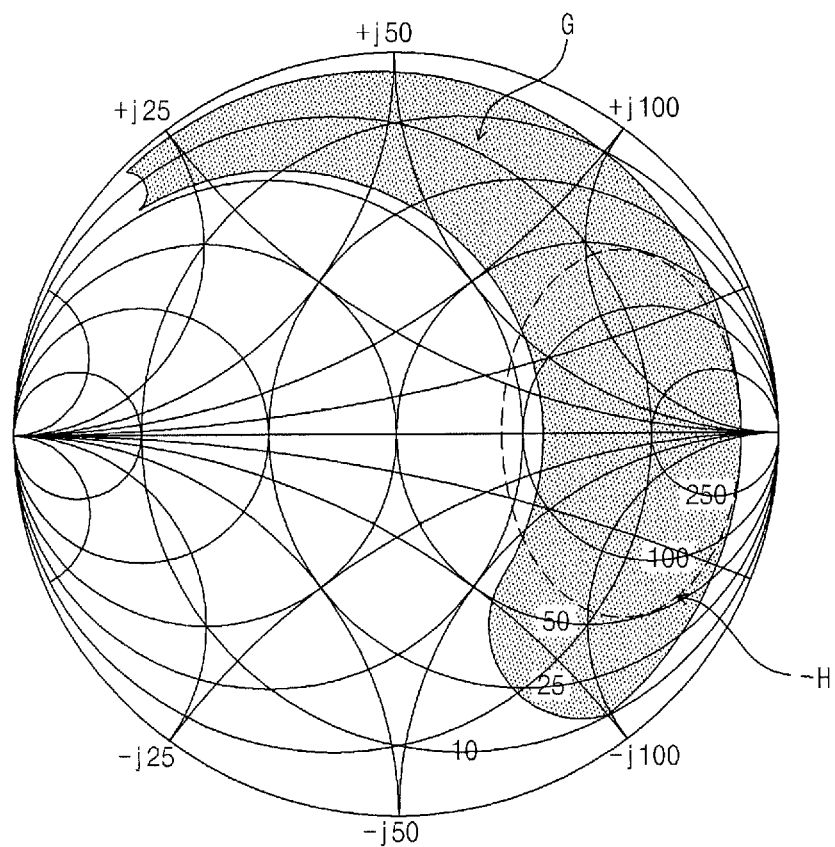

FIGS. 10 and 11 illustrate a Π-type matching circuit and the Smith Chart of the matching circuit, respectively.

Referring to FIGS. 10 and 11, a first variable capacitor (C1) 41 is coupled between an input terminal $N_{IN}$ and a ground. An inductor 43 is coupled between the input terminal MK and an output terminal $N_{OUT}$. One end of a second variable capacitor (C2) 42 is connected to the output terminal $N_{OUT}$, and the other end thereof is grounded.

When a frequency supplied to the input terminal Nm is 100 MHz, an inductance of the inductor 43 is 120 nH, capacitance of the first variable capacitor 41 is 25 to 100 pF, and capacitance of the second variable capacitor 42 is 10 to 100 pF, a region that can be scanned on the Smith Chart is represented by G. When a frequency is 100 MHz, a plasma load may be positioned in an H region.

Accordingly, when a real part of the plasma load is 50 ohms or greater and an imaginary part thereof is hundreds of ohms, the Π-type matching circuit may perform more effective matching in a high-frequency region than a standard L-type matching circuit.

FIG. 12 illustrates an impedance matching apparatus 100 according to an embodiment of the present invention.

Referring to FIG. 12, the impedance matching apparatus 100 matches impedance with a plasma load $Z_L$. The impedance matching apparatus 100 includes a first frequency impedance matching circuit unit 181 transferring an output of a first frequency RF power source unit 112, operating at a first frequency, to the plasma load $Z_L$ and a second frequency impedance matching circuit unit 183 transferring an output of a second frequency RF power source unit 114, operating at a second frequency higher than the first frequency, to the plasma load $Z_L$. The first frequency impedance matching circuit unit 181 includes a T-type matching circuit 130. The second frequency impedance matching circuit unit 183 includes a standard L-type matching circuit 160. The first frequency may be one of 0.1 to 14 MHz, and the second frequency may be one of 10 to 200 MHz.

The T-type matching circuit 130 includes a first variable capacitor (C1) 131 connected to an input terminal NUN receiving a power of the first frequency RF power source unit 112, a second variable capacitor (C2) 133 having one end directly connected to the first variable capacitor 131 and the other end outputting the power of the first frequency RF power source unit 112, and a first inductor 132 having one end connected to a connection terminal N5 of the first and second variable capacitors 131 and 133 and the other end grounded.

Capacitances of the first variable capacitor 131 and the second variable capacitor 133 vary depending on the plasma load $Z_L$, allowing an incident power to be maximally transferred to the plasma load $Z_L$. The plasma load $Z_L$ may include an electrode or antenna for plasma generation.

The first variable capacitor 131 and the second variable capacitor 133 may further include fixed capacitors connected in series to vary the capacitances. The first variable capacitor 131 and the second variable capacitor 133 may be mechanically connected to a driving motor. Thus, the capacitances of the first variable capacitor 131 and the second variable capacitor 133 may be controlled by rotation of the driving motor.

A vacuum container 192 may include a first electrode 194 and a second electrode 196 spaced apart from the first electrode 194. A substrate may be disposed on the second electrode 196. Outputs of the first frequency impedance matching circuit unit 181 and the second frequency impedance matching circuit unit 183 may be provided to the second electrode 196 after being combined at a combination terminal N1. Thus, the second electrode 196 may generate plasma.

The first frequency RF power source unit 112 may adjust ion energy impinging on the substrate 198, and the second frequency RF power source unit 114 may control the density of the plasma. The vacuum container 192 may be configured to perform an etching process, a deposition process or a surface-treating process. The impedance matching apparatus 100 may be connected to the second electrode 196.

Figure 13:
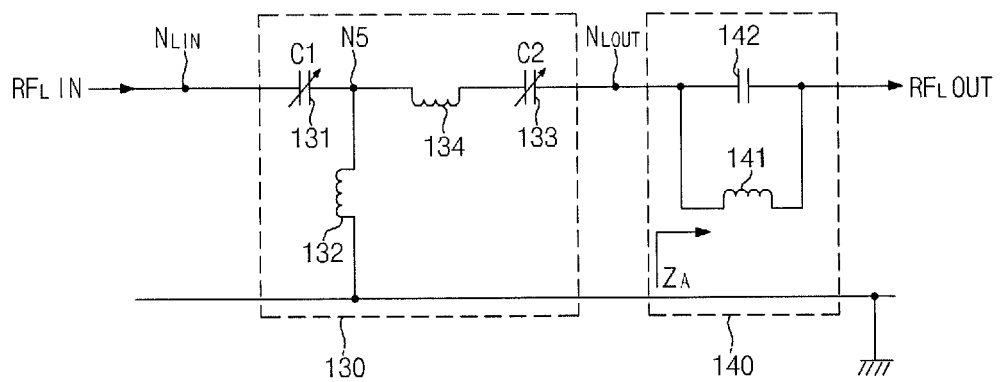
FIGS. 13 to 15 illustrate T-type matching circuits according to other embodiments of the present invention.
Figure 14:
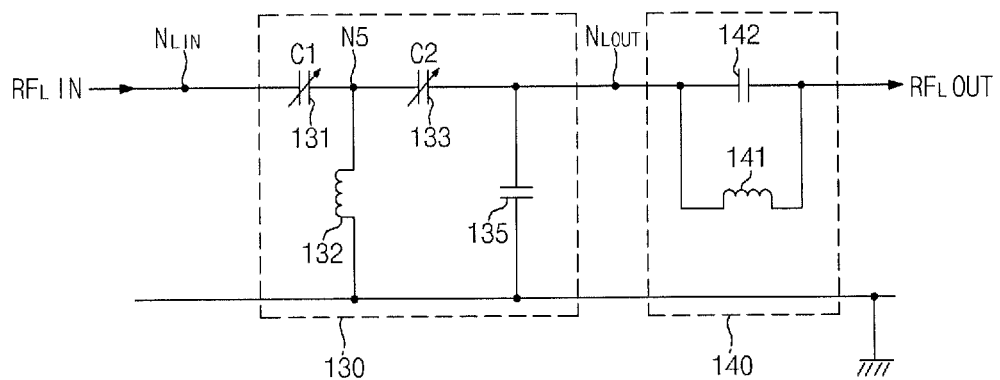
Figure 15:
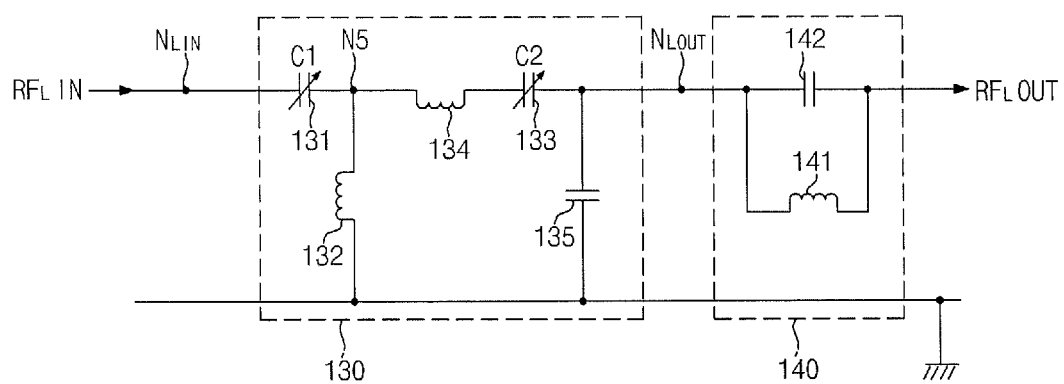

FIGS. 13 to 15 illustrate T-type matching circuits according to other embodiments of the present invention.

Referring to FIG. 13, the T-type matching circuit 130 may includes a first variable capacitor 131, a second variable capacitor 133, a first inductor 132, and a second inductor 134. One end of the first variable capacitor 131 is connected to an input terminal $N_{LIN}$ receiving a power of the first frequency RF power source unit 112. One end of the first inductor 132 is connected to the other end of the first variable capacitor 131, and the other end of the first inductor 132 is grounded. One end of the second inductor 134 is connected to a connection terminal N5 of the first inductor 132 and the first variable capacitor 131. One end of the second variable capacitor 133 is connected to the other end of the second inductor 134, and the other end of the second variable capacitor 133 is connected to an output terminal $N_{LOUT}$. The locations of the second inductor 134 and the second variable capacitor 133 are interchangeable.

Referring to FIG. 14, the T-type matching circuit 130 may include a first variable capacitor 131, a second variable capacitor 133, a first inductor 132, and a fixed capacitor 135. One end of the first variable capacitor 131 is connected to an input terminal $N_{LIN}$ receiving a power of a first frequency RF power source unit 112. One end of the first inductor 132 is connected to the other end of the first variable capacitor 131, and the other end of the first inductor 132 is grounded. One end of the second variable capacitor 133 is connected to a connection terminal N5 of the first inductor 132 and the first variable capacitor 131. The other end of the second variable capacitor 133 is connected to an output terminal $N_{LOUT}$. One end of the fixed capacitor 135 is connected to the output terminal $N_{LOUT}$.

Referring to FIG. 15, the T-type matching circuit 130 may include a first variable capacitor 131, a second variable capacitor 133, a first inductor 132, a second inductor 134, and a fixed capacitor 135. One end of the first variable capacitor 131 is connected to an input terminal $N_{LIN}$ receiving a power of a first frequency RF power source unit 112. One end of the first inductor 132 is connected to the other end of the first variable capacitor 131, and the other end of the first inductor 132 is grounded.

One end of the second inductor 134 is connected to a connection terminal N5 of the first inductor 132 and the first variable capacitor 131. One end of the second variable capacitor 133 is connected to the other end of the second inductor 134, and the other end of the second variable capacitor 133 is connected to the output terminal $N_{LOUT}$. One end of the fixed capacitor 135 is connected to the output terminal $N_{LOUT}$, and the other end of the fixed capacitor 135 is grounded. The locations of the second inductor 134 and the second variable capacitor 133 are interchangeable.

Returning to FIG. 12, the first frequency matching circuit unit 181 may include a first frequency output filter unit 140 disposed between the T-type matching circuit 130 and the combination terminal N1. The first frequency output filter unit 130 may eliminate harmonics and intermodulation caused by the first frequency component and the second frequency component.

A task of a dual frequency matching circuit is to easily perform impedance matching in a first frequency region of low frequency. Another task of the dual frequency matching circuit is to minimize interference of a first frequency and a second frequency. Accordingly, the first frequency output filter unit 140 may minimize the interference. Accordingly, when the first frequency output filter unit 140 is disposed inside the first T-type matching circuit 130 or the second frequency output filter unit 170 is disposed inside the standard L-type matching circuit 160, the first frequency impedance matching circuit unit 181 and the second frequency impedance matching circuit unit 183 may interfere with each other.

More specifically, the T-type matching circuit 130 may be affected by the capacitances of the variable capacitors C1 and C2 of the standard L-type matching circuit 160. Conversely, the standard L-type matching circuit 160 may be affected by the capacitances of the variable capacitors C1 and C2 of the T-type matching circuit 130.

The first frequency output filter unit 140 must be disposed between the T-type matching circuit 130 and the connection terminal N1 to eliminate interference of first frequency impedance matching circuit unit 181 and the second frequency impedance matching circuit unit 183. In addition, the second frequency output filter unit 170 must be disposed between the standard L-type matching circuit 160 and the connection terminal N1.

The first frequency output filter unit 140 may include a fixed capacitor 142 and an inverter 141 connected in parallel to the fixed capacitor 142. One end of the fixed capacitor 142 is connected to an output terminal $N_{LOUT}$ of a T-type matching circuit, and the other end of the fixed capacitor 142 is connected to the connection terminal N1. The first frequency output filter unit 140 may be a bandstop filter which stops the second frequency component f2 through LC resonance.

In terms of the second frequency, a plasma load $Z_L$ and the first impedance matching circuit unit 181 are connected in parallel to the output terminal N1 of the second frequency impedance matching circuit unit 183. Conventionally, a reactance of the plasma load $Z_L$ may have a value ranging from −100 ohms to +100 ohms. Accordingly, the first frequency impedance matching circuit unit 181 preferably includes a first frequency output filter 140 having at least 10 times larger impedance than the plasma load $Z_L$. For this reason, a power of the second frequency RF power source unit 114 may be mainly transferred to the plasma load $Z_L$ to be consumed.

An absolute value of impedance $Z_A$ of the first frequency output filter 140 may be configured to have 1000 ohms or more. For achieving this, the first frequency output filter 140 may include a bandstop filter using LC resonance. Since a reactance of the second variable capacitor 133 of the T-type matching circuit 130 is negative, the impedance of the first frequency output filter 140 may be preferably designed to be negative. Accordingly, the reactance of the second variable capacitor 133 of the T-type matching circuit 130 and the impedance of the first frequency output filter 140 may be summed up to increase an absolute value of the summed impedance. In terms of the second frequency, as the absolute value of the summed impedance increases, the power of the second frequency RF power source unit is mainly supplied to the plasma load $Z_L$ to be consumed.

According to a modified embodiment of the present invention, the first frequency output filter unit 140 may be implemented using the inductor 141 and a parasitic capacitor that is parasitic on the inductor 141.

Figure 16:
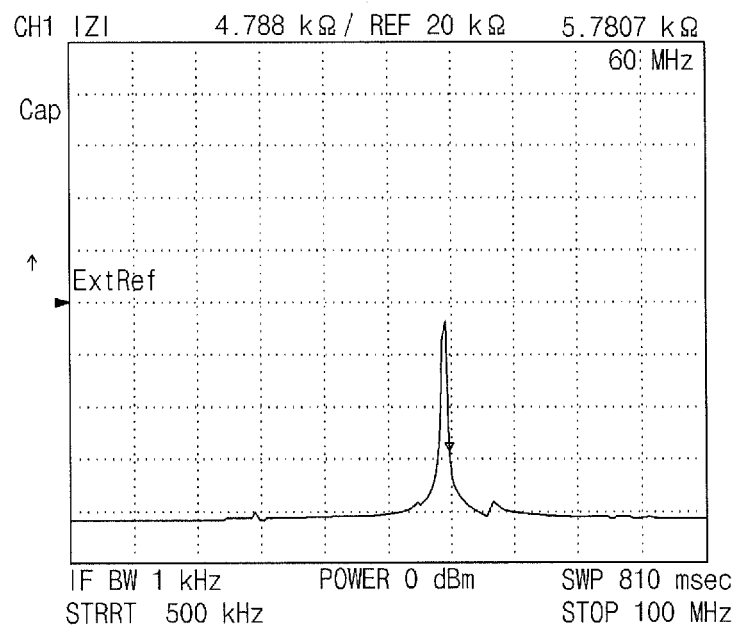
FIGS. 16 and 17 show an absolute value and a phase of an impedance of a first frequency output filter according to an embodiment of the present invention, respectively.
Figure 17:
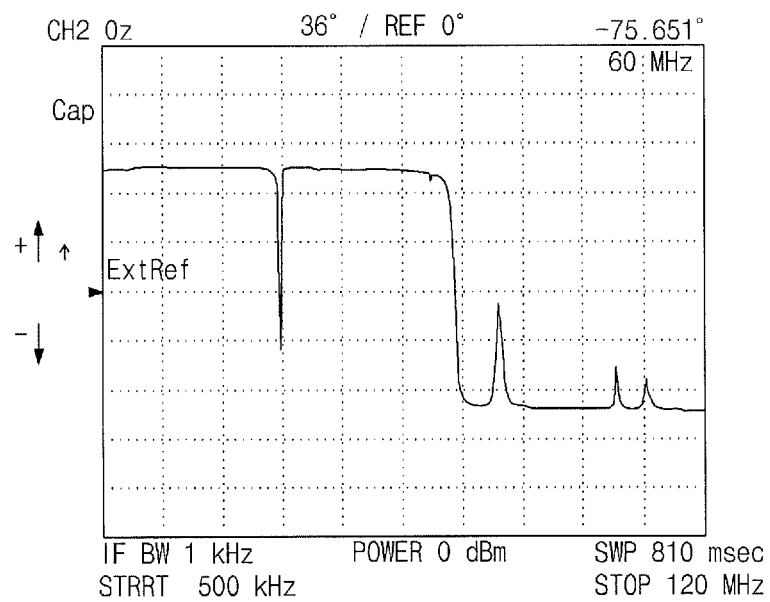

FIGS. 16 and 17 show an absolute value and a phase of an impedance of a first frequency output filter according to an embodiment of the present invention, respectively.

Referring to FIGS. 16 and 17, the absolute value of the impedance of the first frequency output filter 140 has 5.7 kilo ohms (KΩ) at a second frequency f2 of 60 MHz. A phase angle of the impedance is −75.5 degrees at the second frequency f2 of 60 MHz. A first frequency may be 2 MHz.

Returning to FIG. 12, the first frequency matching circuit unit 181 may includes a first frequency input filter unit 120 disposed between the T-type matching circuit 130 and the first frequency RF power source unit 112. The first frequency input filter unit 120 may be a lowpass filter.

The first frequency input filter unit 120 may include an inductor 122 disposed between an output terminal N2 of the first frequency RF power source unit 112 and the input terminal $N_{LIN}$ of the T-type matching circuit 130, a first fixed capacitor 121 having one end connected to the output terminal N2 of the first frequency RF power source unit 112 and the other end grounded, and a second fixed capacitor 123 having one end connected to the input terminal $N_{LIN}$ of the T-type matching circuit 130 and the other end grounded. The first frequency input filter unit 120 may be a lowpass filter that passes the first frequency component while stopping the second frequency component and harmonic components of the first frequency components.

According to a modified embodiment of the present invention, the first frequency input filter unit 120 may comprise a bandpass filter which passes a first frequency component.

Returning to FIG. 6, a second frequency impedance matching circuit unit 183 may include a standard L-type matching circuit 160. The standard L-type matching circuit 160 may includes a first variable capacitor 161 coupled between an input terminal $N_{HIN}$ receiving a power of the second frequency RF power source unit 114 and a ground and a second variable capacitor 162 having one end connected to the input terminal $N_{HIN}$ and the other end connected to an output terminal $N_{HOUT}$ transferring a power of the second frequency RF power source unit 114. The first variable capacitor 161 or the second variable capacitor 162 may include an auxiliary fixed capacitor. The first and second variable capacitors 161 and 162 and the auxiliary fixed capacitor may be combined in series or parallel.

Figure 18:
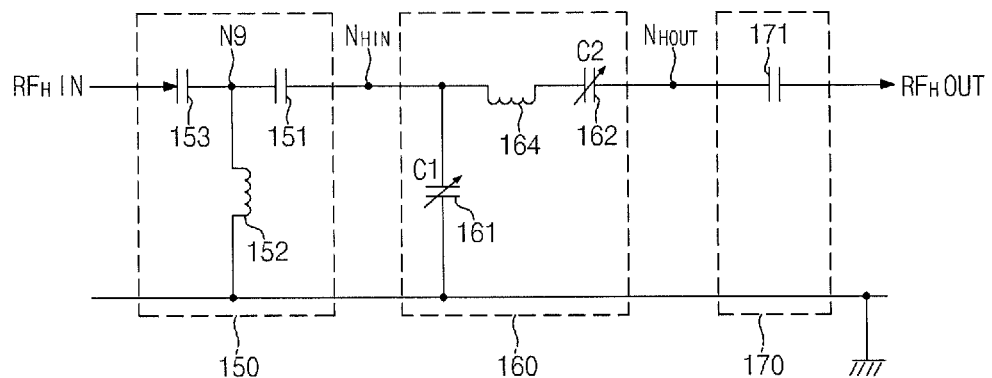
FIGS. 18 to 20 illustrate a standard L-type matching circuit according to other embodiments of the present invention.
Figure 19:
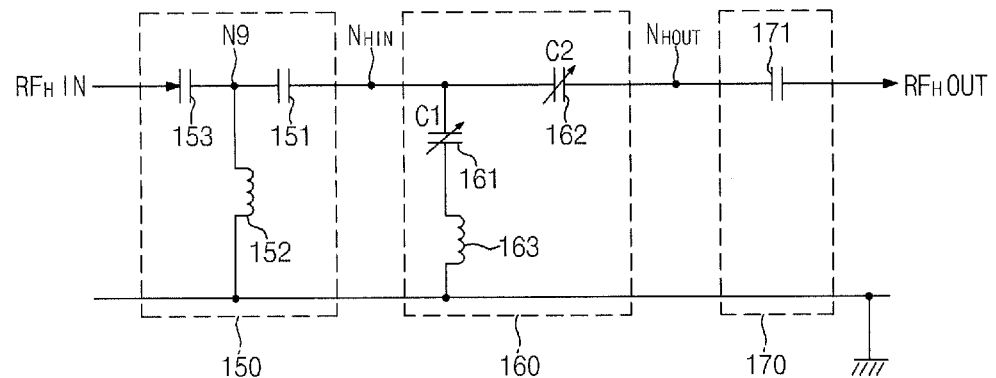
Figure 20:
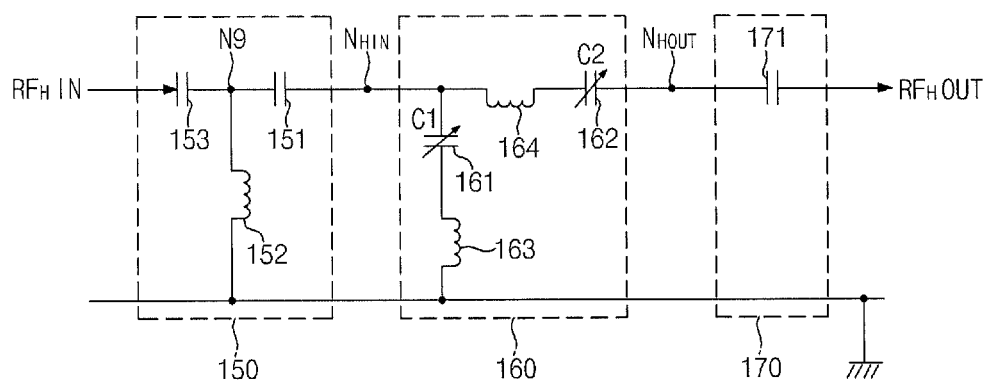
Figure 21:
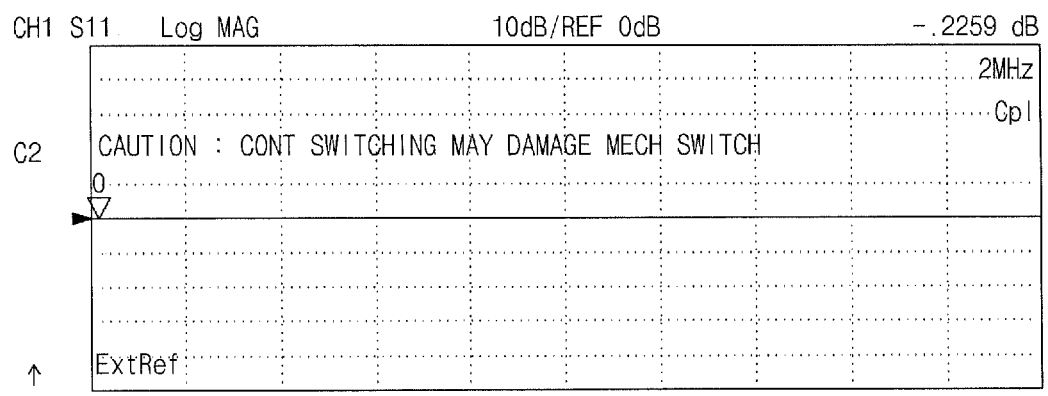
FIGS. 21 to 24 illustrate characteristics of scattering matrix (S) characteristics of the impedance matching circuit in FIG. 12.
Figure 22:
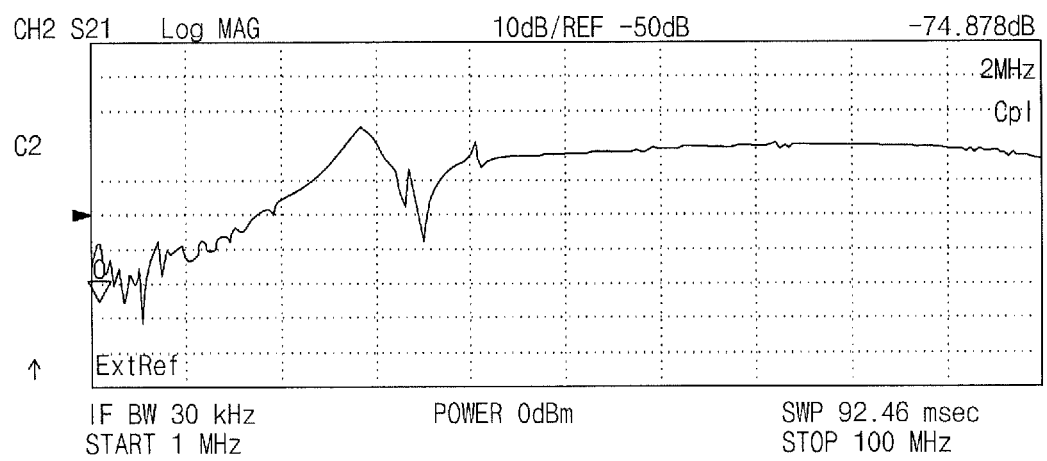
Figure 23:
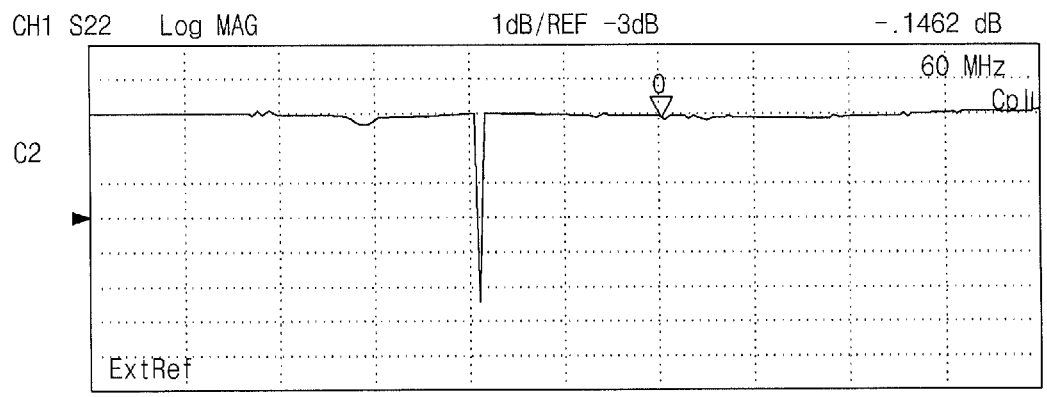
Figure 24:
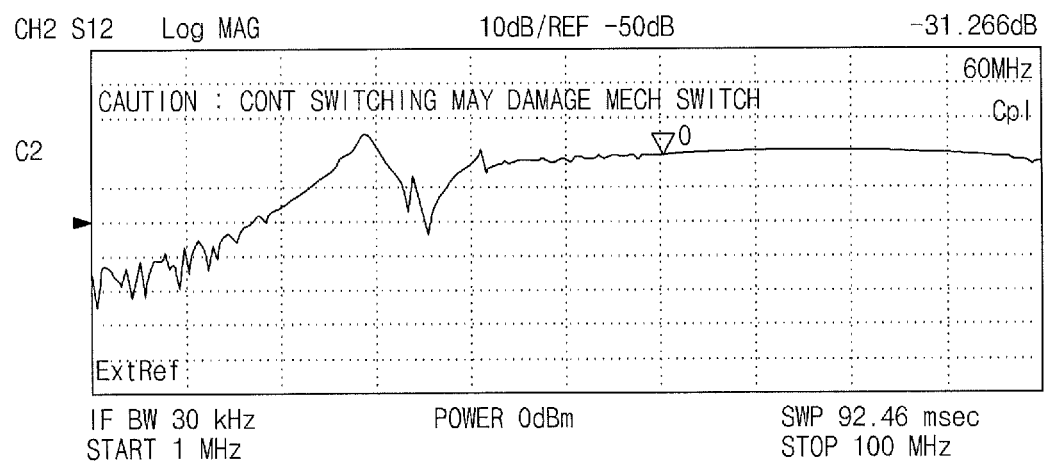

FIGS. 18 to 20 illustrate a standard L-type matching circuit 160 according to other embodiments of the present invention.

Referring to FIG. 18, the standard L-type matching circuit 160 may include a first variable capacitor 161, a second variable capacitor 162, and a first inductor 164. One end of the first variable capacitor 161 may be connected to an input terminal $N_{HIN}$ receiving a power of the second frequency RF power source unit 114, and the other end of the first variable capacitor 161 may be grounded. One end of the first inductor 164 may be connected to the input terminal $N_{HIN}$. One end of the second variable capacitor 162 may be connected to the other end of the first inductor 164, and the other end of the second variable capacitor 162 may be connected to the output terminal $N_{HOUT}$ transferring the power of the second RF power source unit 114.

Referring to FIG. 19, the standard L-type matching circuit 160 may includes a first variable capacitor 161, a second variable capacitor 162, and a first inductor 163. One end of the first variable capacitor 161 may be connected to an input terminal $N_{HIN}$ receiving a power of the second frequency RF power source unit 114. One end of the first inductor 163 may be connected to the other end of the first variable capacitor 161, and the other end of the first inductor 163 may be grounded. One end of the second variable capacitor 162 may be connected to the input terminal $N_{HIN}$, and the other end of the second variable capacitor 162 may be connected to an output terminal $N_{HOUT}$ transferring the power of the second frequency RF power source unit 114.

Referring to FIG. 20, the standard L-type matching circuit 160 may include a first variable capacitor 161, a second variable capacitor 162, a first inductor 163, and a second inductor 164. One end of the first variable capacitor 161 may be connected to an input terminal $N_{HIN}$ receiving a power of the second RF power source unit 114. One end of the first inductor 163 may be connected to the other end of the first variable capacitor 161, and the other end of the first inductor 163 may be grounded. One end of the second inductor 164 may be connected to the input terminal $N_{HIN}$. One end of the second variable capacitor 162 may be connected to the other end of the second inductor 164, and the other end of the second variable capacitor 162 may be connected to an output terminal $N_{HOUT}$ transferring the power of the second frequency RF power source unit 114.

Returning to FIG. 12, the second frequency impedance matching circuit unit 183 may include a second frequency output filter unit 170 disposed between the standard L-type matching circuit 160 and the combination unit N1. The second frequency output filter unit 170 may include a fixed capacitor 171. The fixed capacitor 171 may be coupled between the output terminal $N_{HOUT}$ of the standard L-type matching circuit 160 and the combination terminal N1.

The second frequency output filter unit 170 may be a highpass filter which passes the second frequency component. At the first frequency, an absolute value of impedance of the second frequency output filter unit 170 may be 1000 ohms or more.

In terms of the first frequency, a plasma load $Z_L$ and the second frequency impedance matching circuit unit 183 are connected in parallel to an output terminal N1 of a first frequency impedance matching circuit unit 181. Conventionally, a reactance of the plasma load may have a value ranging from −100 ohms to +100 ohms. Accordingly, the second frequency impedance matching circuit unit 183 preferably includes a second frequency output filter unit 170 having at least 10 times larger impedance than the plasma load $Z_L$. For this reason, a power of the second frequency RF power source unit 114 may be mainly transferred to the plasma load $Z_L$ to be consumed.

In the case that there no second frequency output filter unit 170, impedance of the second frequency impedance matching circuit unit 183 may be changed when the second frequency impedance matching circuit unit 183 changes variable capacitors C1 and C2 to match impedance. In this case, in terms of a first frequency, the plasma load $Z_L$ and the second frequency impedance matching circuit unit 183 are connected in parallel to the output terminal N1 of the first frequency impedance matching circuit unit 181. The plasma load $Z_L$ varies depending on time, and the impedance of the second frequency impedance matching circuit unit 183 varies depending on time. Accordingly, since the first frequency impedance matching circuit unit 181 may be affected, the second frequency output filter unit 170 is required to allow the second frequency impedance matching circuit unit 183 and the first frequency impedance matching circuit unit 181 to operate independently. For the same reason, the first frequency output filter unit 140 is required.

Returning to FIG. 12, the second frequency impedance matching circuit unit 183 may include a second frequency input filter unit 150 disposed between the standard L-type matching circuit 160 and the second frequency RF power source unit 114.

The second frequency input filter unit 150 may include a first capacitor 151 having one end connected to an output terminal N8 of the second frequency RF power source unit 114, a second capacitor 153 having one end connected to the input terminal $N_{HIN}$ of the second frequency matching circuit unit 160 and the other end connected to the other end of the first capacitor 151, and an inductor 152 having one end connected to a connection terminal N9 of the first and second capacitors 151 and 153 and the other end grounded. The second frequency input filter unit 150 may be a highpass filter which passes the second frequency component and stops the first frequency component and harmonic components of the first frequency component.

According to a modified embodiment, the second frequency input filter unit 150 may comprise a bandpass filter which passes a second frequency component.

FIGS. 21 to 24 illustrate characteristics of scattering matrix (S) characteristics of the impedance matching circuit in FIG. 12.

Referring to FIGS. 21 to 24, the scattering matrix was measured under the state that a plasma load $Z_L$, a first frequency input filter 120, and a second frequency input filter 150 are removed. A first port is the side of a first frequency RF power source unit 112, and a second port is the side of a second frequency RF power source unit 114. In the figures, S11 corresponds to a reflection coefficient when viewed from the first port, S22 corresponds to a reflection coefficient when viewed from the second port, S21 is a transmission coefficient passing from the second port to the first port, and S12 is a transmission coefficient passing from the port 1 to the second port.

There will be described a case where a first frequency is 2 MHz and a second frequency is 60 MHz. At the frequency of 2 MHZ, the S11 is substantially 0. At the frequency of 2 MHz, the S21 is –74.8 dB. At the frequency of 60 MHz, the S22 is substantially 0. At the frequency of 60 MHz, the S12 is –31.5 dB. Accordingly, it could be understood that a first frequency impedance matching circuit unit 181 and a second frequency impedance matching circuit 18 do not interfere with each other.

Figure 25:
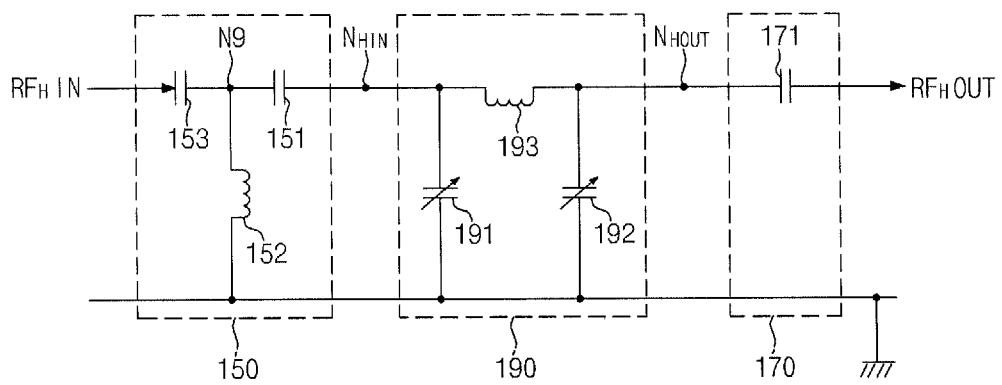
FIG. 25 illustrates a Π-type matching circuit according to another embodiment of the present invention.

FIG. 25 illustrates a Π-type matching circuit 190 according to another embodiment of the present invention.

Referring to FIG. 25, the Π-type matching circuit 190 may include a first variable capacitor 191 coupled between an input terminal $N_{HIN}$ receiving a power of a second frequency RF power source unit and a ground, an inductor 193 having one end connected to the input terminal $N_{HIN}$ and the other end connected to an output terminal $N_{HOUT}$ transferring the power of the second frequency RF power source unit, and a second variable capacitor 192 having one end connected to the other end of the inductor 193 and the other end grounded.

Referring to FIGS. 25, 10, and 11, the second frequency may be 60 MHz or more. A real part of a plasma load may be 50 ohms or more. An imaginary part of the plasma load may be hundreds of ohms.

As described above, according to an embodiment of the present invention, an impedance matching apparatus uses a T-type matching circuit in a low-frequency region to extend a matching area in the low-frequency region. In addition, a conventional standard L-type matching circuit that is easily controllable is used in a high-frequency region to achieve optimal dual-frequency impedance matching in the low-frequency region and the high-frequency region. Moreover, a low-frequency matching circuit and a high-frequency matching circuit each use an output filter to minimize their interference.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. An impedance matching apparatus for matching impedance to a plasma load, comprising:
    a first frequency impedance matching circuit unit configured to transfer an output of a first frequency RF power source unit, operating at a first frequency, to the plasma load; and
    a second frequency impedance matching circuit unit configured to transfer an output of a second frequency RF power source unit, operating at a second frequency higher than the first frequency, to the plasma load,
    wherein the first frequency impedance matching circuit unit includes a T-type matching circuit, and the second frequency impedance matching circuit unit includes a standard L-type matching circuit or a Π-type matching circuit, and
    wherein the first frequency impedance matching circuit unit further includes a first frequency output filter unit disposed between the T-type matching circuit and the plasma load.

2. The impedance matching apparatus of claim 1, wherein the T-type matching circuit comprises:
    a first variable capacitor connected to an input terminal $N_{LIN}$ receiving a power of the first frequency RF power source unit;
    a second variable capacitor having one end connected the first variable capacitor and the other end connected to an output terminal $N_{LOUT}$ outputting a power of the first frequency RF power source unit; and
    a first inductor having one end connected to a connection terminal of the first variable capacitor and the second variable capacitor and the other end grounded.

3. The impedance matching apparatus of claim 2, wherein the T-type matching circuit further includes a second inductor coupled between the connection terminal and the second variable capacitor.

4. The impedance matching apparatus of claim 2, wherein the T-type matching circuit further includes a fixed capacitor having one end connected to the output terminal $N_{LOUT}$ and the other end grounded.

5. The impedance matching apparatus of claim 1, wherein the first frequency is one of 0.1 to 14 MHz, and the second frequency is one of 10 to 200 MHz.

6. The impedance matching apparatus of claim 1,
    wherein the first frequency output filter unit includes:
        a fixed capacitor having one end connected to an output terminal of the T-type impedance matching circuit and the other end connected to the plasma load; and
        an inductor connected in parallel to the fixed capacitor, and wherein the first frequency output filter unit is a bandstop filter stopping a second frequency component through LC resonance.

7. The impedance matching apparatus of claim 6, wherein the first frequency output filter unit has a reactance of –1000 ohms or less at the second frequency.

8. The impedance matching apparatus of claim 1, wherein the standard L-type matching circuit comprises:
    a first variable capacitor coupled between an input terminal $N_{HIN}$ receiving a power of the second frequency RF power source unit and a ground; and
    a second variable capacitor having one end connected to the input terminal $N_{HIN}$ and the other end connected to an output terminal $N_{OUT}$ transferring the power of the second frequency RF power source unit.

9. The impedance matching apparatus of claim 8, wherein the standard L-type matching circuit further includes an inductor connected in series to the second variable capacitor and having one end connected to the input terminal.

10. The impedance matching apparatus of claim 8, wherein the standard L-type matching circuit further includes an inductor connected in series to the first variable capacitor and having one end grounded.

11. The impedance matching apparatus of claim 1, wherein the second frequency is 60 MHz or more, and
wherein the Π-type matching circuit includes:
a first variable capacitor coupled between an input terminal $N_{HIN}$ receiving a power of the second frequency RF power source unit and a ground;
an inductor having one end connected to the input terminal $N_{HIN}$ and the other end connected to an output terminal input terminal $N_{HOUT}$ transferring the power of the second frequency RF power source unit; and
a second variable capacitor having one end connected to the other end of the inductor and the other end grounded.

12. An impedance matching apparatus for matching impedance to a plasma load, comprising:
a first frequency impedance matching circuit unit configured to transfer an output of a first frequency RF power source unit, operating at a first frequency, to the plasma load;
a second frequency impedance matching circuit unit configured to transfer an output of a second frequency RF power source unit, operating at a second frequency higher than the first frequency, to the plasma load; and
a first frequency input filter unit disposed between the first frequency impedance matching circuit unit and the first frequency RF power source unit,
wherein the first frequency impedance matching circuit unit includes a T-type matching circuit, and the second frequency impedance matching circuit unit includes a standard L-type matching circuit or a Π-type matching circuit.

13. The impedance matching apparatus of claim 12, wherein the first frequency input filter unit comprises:
an inductor disposed between an output terminal of the first frequency RF power source unit and the input terminal of the T-type matching circuit;
a first fixed capacitor having one end connected to an output terminal of the first frequency RF power source unit and the other end grounded; and
a second fixed capacitor having one end connected to the input terminal of the second T-type matching circuit and the other end grounded.

14. An impedance matching apparatus for matching impedance to a plasma load, comprising:
a first frequency impedance matching circuit unit configured to transfer an output of a first frequency RF power source unit, operating at a first frequency, to the plasma load; and
a second frequency impedance matching circuit unit configured to transfer an output of a second frequency RF power source unit, operating at a second frequency higher than the first frequency, to the plasma load,
wherein the first frequency impedance matching circuit unit includes a T-type matching circuit, and the second frequency impedance matching circuit unit includes a standard L-type matching circuit or a Π-type matching circuit, and
wherein the second frequency impedance matching circuit unit further includes a second frequency output filter unit disposed between the standard L-type matching circuit or Π-type matching circuit and the plasma load.

15. The impedance matching apparatus of claim 14, wherein the second frequency output filter unit includes a fixed capacitor disposed between an output terminal of the standard L-type matching circuit and the plasma load, and
wherein the second frequency output filter unit is a high-pass filter passing the second frequency component, and an absolute value of impedance of the second frequency output filter unit is 1000 ohms or more at the first frequency.

16. An impedance matching apparatus for matching impedance to a plasma load, comprising:
a first frequency impedance matching circuit unit configured to transfer an output of a first frequency RF power source unit, operating at a first frequency, to the plasma load; and
a second frequency impedance matching circuit unit configured to transfer an output of a second frequency RF power source unit, operating at a second frequency higher than the first frequency, to the plasma load,
wherein the first frequency impedance matching circuit unit includes a T-type matching circuit, and the second frequency impedance matching circuit unit includes a standard L-type matching circuit or a Π-type matching circuit, and
wherein the second frequency matching circuit unit further includes a second frequency input filter unit disposed between an input terminal of the standard L-type matching circuit or an input terminal of the Π-type matching circuit and an output terminal of the second frequency RF power source unit.

17. The impedance matching apparatus of claim 16, wherein the second frequency input filter unit includes:
a first capacitor having one end connected to the output terminal of the second frequency RF power source unit;
a second capacitor having one end connected to an input terminal of the second frequency matching circuit unit and the other end connected to the other end of the first capacitor; and
an inductor having one end connected to the other end of the first capacitor and the other end of the second capacitor and the other end grounded.

* * * * *